United States Patent [19]
Matsushita et al.

[11] Patent Number: 5,811,348
[45] Date of Patent: Sep. 22, 1998

[54] METHOD FOR SEPARATING A DEVICE-FORMING LAYER FROM A BASE BODY

[75] Inventors: Takeshi Matsushita; Hiroshi Tayanaka, both of Kanagawa, Japan

[73] Assignee: Sony Corporation, Tokyo, Japan

[21] Appl. No.: 595,382

[22] Filed: Feb. 1, 1996

[30] Foreign Application Priority Data

Feb. 2, 1995 [JP] Japan ..................................... 7-037655

[51] Int. Cl.⁶ ................................................... H01L 21/30
[52] U.S. Cl. ........................................... 438/455; 438/458
[58] Field of Search ................................... 438/458, 459, 438/464, 455, 57; 136/244

[56] References Cited

U.S. PATENT DOCUMENTS

| | | | |
|---|---|---|---|
| 4,727,047 | 2/1988 | Bozler et al. | 438/458 |
| 5,250,460 | 10/1993 | Yamagata et al. | 438/458 |
| 5,362,638 | 11/1994 | Takenada et al. | 438/458 |
| 5,459,081 | 10/1995 | Kajita | 438/458 |

*Primary Examiner*—Tuan H. Nguyen
*Attorney, Agent, or Firm*—Hill & Simpson

[57] ABSTRACT

A porous Si layer is formed on a single-crystal Si substrate, and then a p⁺-type Si layer, p-type Si layer and n⁺-type Si layer which all make up a solar cell layer. After a protective film is made on the n⁺-type Si layer, the rear surface of the single-crystal Si substrate is bonded to a tool, and another tool is bonded to the front surface of the protective film. Then, the tools are pulled in opposite directions to mechanically rupture the porous Si layer and to separate the solar cell layer from the single-crystal substrate. The solar cell layer is subsequently sandwiched between two plastic substrates to make a flexible thin-film solar cell.

11 Claims, 9 Drawing Sheets

METHOD FOR SEPARATING A DEVICE-FORMING LAYER FROM A BASE BODY

BACKGROUND OF THE INVENTION

1. Field of the Invention

This invention relates to a method for separating a device-forming layer from a base body suitable for use in fabricating thin-film solar cells, for example.

2. Description of the Related Art

Forty years or so have passed since the first solar cell was invented. Although some solar cells are used in practice, reduction in cost is of a particular importance for their full-scale use in the future. Additionally, from the viewpoint of preventing the global warming, the time for energy recovery should be reduced to one year or less. Therefore, in order to minimize the energy required for fabricating solar cells, thin-film solar cells are more preferable to thick-film solar cells which need more energy for fabrication.

On the other hand, thin-film solar cells can be bent to an extent, which permits them to be mounted along a curved portion of a vehicle body or a curved outer portion of a portable electric appliance, for example, to generate electrical energy. If thin-film solar cells are used in solar battery chargers, they can be compactly folded and can be extended only in actual operation.

Conventionally known as thin-film solar cells are amorphous silicon solar cells which are made on plastic substrates. These amorphous silicon solar cells, however, involve the problem that the efficiency is originally low and becomes still lower during its use. To cope with the problem, there has been a demand for thin-film solar cells using single-crystal silicon or polycrystalline silicon having a higher efficiency than amorphous silicon.

OBJECT AND SUMMARY OF THE INVENTION

Since the temperature becomes significantly high in the process of producing single-crystal silicon or polycrystalline silicon, it is difficult to make such silicon on a plastic or glass substrate.

The invention has been made to solve the problem involved in the prior art.

That is, an object of the invention is to provide a method for separating a device-forming layer from a base body, which can fabricate a high-performance thin-film device, such as thin-film solar cell, having a high efficiency.

According to the invention, there is provided a method for separating a device-forming layer from a base body, comprising: making the device-forming layer on the base body via a separation layer; and separating the device-forming layer from the base body by mechanically inducing a rupture at least at one of inner portions of the separation layer and interfaces of the separation layer with the device-forming layer and the base body.

In a typical aspect of the invention, the mechanical strength of the separation layer is lower than those of the base body and the device-forming layer.

The separation layer used in the invention may be porous, polycrystalline or amorphous.

In a typical aspect of the invention, the separation layer is made of a semiconductor. The semiconductor may be an element semiconductor or a compound semiconductor. The former may be silicon (Si), and the latter may be gallium arsenide (GaAs).

The base body used in the invention is preferably made of a single crystal, but may be made of a polycrystal.

The base body used in the invention is preferably made of single-crystal silicon, but may be made of cast polycrystalline silicon, for example.

In a typical aspect of the invention, the device-forming layer is made of a semiconductor. In this case, the device is a semiconductor device.

In a preferred embodiment of the invention, the device-forming layer is made of single-crystal silicon.

In a typical aspect of the invention, the mechanical rupture is induced at least at one of inner portions of the separation layer and interfaces of the separation layer with the device-forming layer and the base body by pulling the base body and the device-forming layer in opposite directions. More practically, one of major surfaces of the base body opposite from the separation layer is bonded to a first tool while one of major surfaces of the device-forming layer opposite from the separation layer is bonded to a second tool, and the first tool and the second tool are pulled in opposite directions to induce a mechanical rupture at least at one of inner portions of the separation layer and interfaces of the separation layer with the device-forming layer and the base body.

In a typical embodiment of the invention, the separation layer is made of porous silicon by anodic oxidation of the base body made of single-crystal silicon, and the device-forming layer of single-crystal silicon is made on the separation layer.

In a typical aspect of the invention, after the mechanical rupture of the separation layer, the remainder of the separation layer still lying on the base body is removed by polishing and/or etching, and the remainder of the separation layer still lying on the rear surface of the device-forming layer is also removed by polishing and/or etching. In the case where the separation layer is made by a process, such as anodic oxidation, which invites a decrease in thickness of the base body, the original thickness can be restored by growing the same material as the base body on the base body.

The device-forming layer in the present invention may be used for various devices as a layer on which solar cells, for example, are made.

According to the invention having the above-summarized constructions, since the device-forming layer is separated from the base body by inducing a mechanical rupture at least at one of inner portions of the separation layer and interfaces of the separation layer with the device-forming layer and the base body, if the device-forming layer is thin, a thin-film device such as thin-film solar cell can be fabricated by using the thin device-forming layer. In this case, since the device-forming layer is thin and the base body can be used repeatedly without the need for polishing or etching the base body itself upon separating the device-forming layer, thin-film devices such as thin-film solar cells can be fabricated economically. If the device-forming layer is single-crystal or polycrystalline, high-performance thin-film devices, e.g. thin-film solar cells with a high efficiency, can be obtained. Additionally, the thin-film devices, i.e. thin-film solar cells, can be bent to an extent. That is, flexible thin-film solar cells or other flexible thin-film devices can be obtained.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Figure 1:
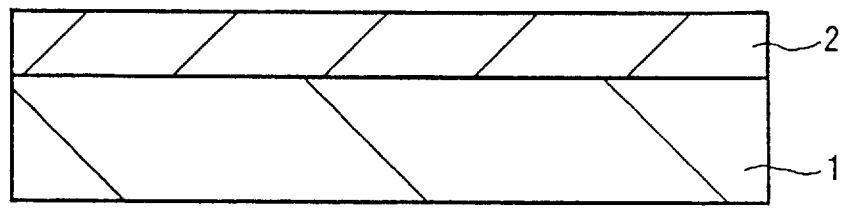
FIG. 1 is a cross-sectional view for explaining a method for fabricating a thin-film solar cell according to a first embodiment of the invention.

Some embodiments of the invention are described below with reference to the drawings. In all drawings, the same or equivalent elements are labelled common reference numerals.

FIGS. 1 through 10 are cross sectional views sequentially showing different steps of a method for fabricating a thin-film solar cell according to a first embodiment of the invention.

The method for fabricating a thin-film solar cell according to the first embodiment begins with the step of FIG. 1 where a porous Si layer 2 is made by anodic oxidization of a single-crystal Si substrate 1. The method for making the porous Si layer 2 by anodic oxidization is well known (for example, Applied Physics, Vol. 57, No. 11, p.1710(1988)). For example, if the current density is 30 mA and the solution used for the anodic oxidization is $HF:H_2O:C_2H_5OH=1:1:1$, the porous Si layer 2 obtained has a thickness of 5 $\mu$m to 50 $\mu$m and a porosity of 10% to 50%. From the viewpoint of repeated use of the single-crystal Si substrate 1, the thickness of the porous Si layer 2 is desired to be minimized to 5 $\mu$m to 15 $\mu$m, e.g. to 10 $\mu$m approximately, in order to minimize the decrease in thickness of the single-crystal Si substrate 1 and to increase the possible time of its use. Additionally, the single-crystal Si substrate 1 is preferably of a p-type, taking it into consideration to make the porous Si layer 2 on it by anodic oxidization; however, even if it is of an n-type, the porous Si layer 2 can be made under appropriate conditions.

Figure 2:
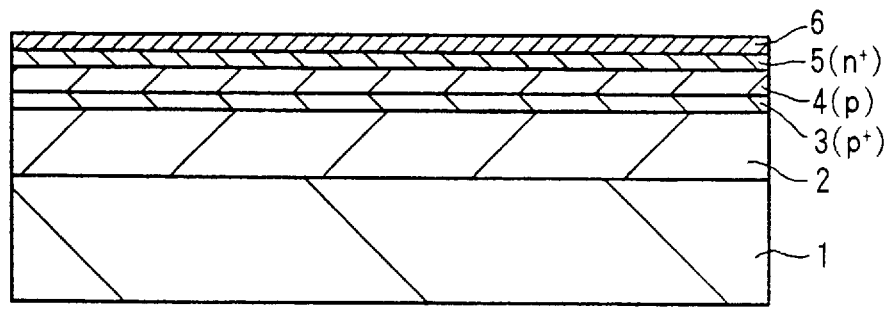
FIG. 2 is a cross-sectional view for explaining the method for fabricating a thin-film solar cell according to the first embodiment of the invention.

As shown in FIG. 2, next stacked on the porous Si layer 2 are a $p^+$-type Si layer 3, p-type Si layer 4 and $n^+$-type Si layer 5 by sequential epitaxial growth by CVD, for example, at a temperature of 700° C. through 1100° C., for example. Subsequently made on the $n^+$-type layer 5 by CVD, for example, is a protective film 6 which may be either a single-layered $SiO_2$ or SiN film or a multi-layered film comprising such single-layered films. Thus, the $p^+$-type Si film 3, p-type Si film 4 and $n^+$-type Si film 5 form a solar cell layer, and their typical total thickness is in the range of 1 $\mu$m to 50 $\mu$m, for example, 5 $\mu$m. In this case, in order to improve the crystallinity of the $p^+$-type Si film 3, p-type Si film 4 and $n^+$-type Si film 5 forming the solar cell layer, it is desired to pre-treat the porous Si layer 2 prior to the epitaxial growth of the Si films 3, 4, 5 to prepare a good condition for subsequent epitaxial growth of these films: namely, the porous Si layer 2 be enforced by oxidization for a short time at a temperature of 400° C. to 600° C., for example, to make thin oxide films along inner walls of inner pores of the porous Si layer 2 and the porous Si film 2 be $H_2$-annealed in a vacuum, for example, at a temperature of 950° C. to 1000° C., for example, so as to fill superficial pores of the porous Si layer 2. In this manner, single-crystal $p^+$-type Si film 3, p-type Si film 4 and $n^+$-type Si film 5 can be obtained (for example, Nikkei Microdevice, Jul. 1994, p.76).

Figure 3:
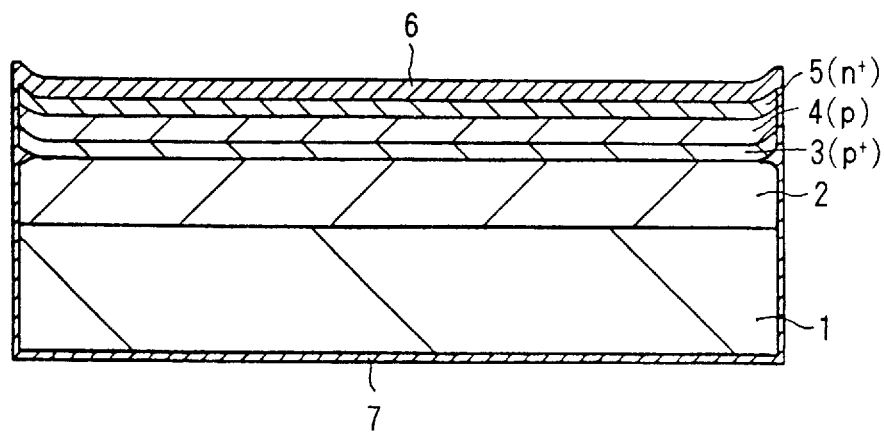
FIG. 3 is a cross-sectional view for explaining the method for fabricating a thin-film solar cell according to the first embodiment of the invention.

Next, as shown in FIG. 3, the entirety of the single-crystal Si substrate 1, on which the porous Si layer 2, $p^+$-type Si film 3, p-type Si film 4, $n^+$-type Si film 5 and protective film 6 are made, is thermally oxidized such that oxide film 7 of $SiO_2$ having a thickness of 50 nm to 500 nm, for example, is formed on the entire surface. During the thermal oxidization, the oxidizing speed of the porous Si layer 2 is faster than the oxidizing speed of the single-crystal Si substrate 1, and the porous Si layer 2 increases in volume. Therefore, the oxide film 7 has portions like a bird's beak at edge portions of the interface between the porous Si layer 2 and the $p^+$-type Si layer 3, and causes all of the $p^+$-type Si layer 3, p-type Si layer 4, $n^+$-type layer 5 and the protective film 6 to rise up at their edges.

Figure 4:
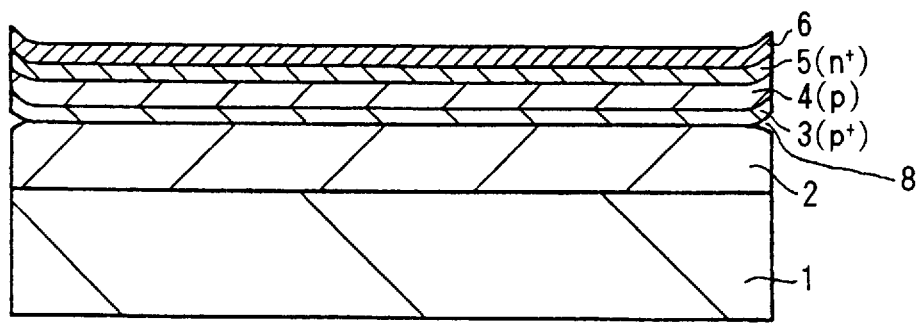
FIG. 4 is a cross-sectional view for explaining the method for fabricating a thin-film solar cell according to the first embodiment of the invention.

After that, the oxide film 7 is removed by etching. As a result, as shown in FIG. 4, wedge-shaped gaps 8 are made at edges of the interface between the porous Si layer 2 and the $p^+$-type Si layer 3. The wedge-shaped gaps 8 facilitate rupture of the porous Si layer 2 when pulled in a subsequent step.

Figure 5:
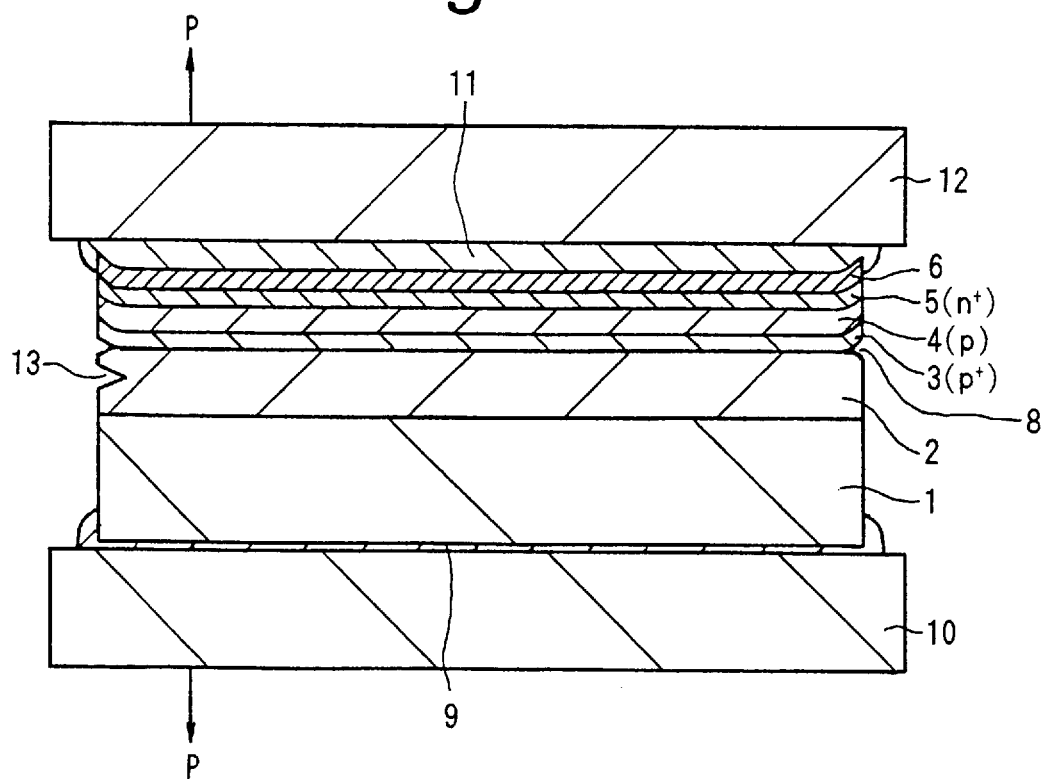
FIG. 5 is a cross-sectional view for explaining the method for fabricating a thin-film solar cell according to the first embodiment of the invention.

Next, as shown in FIG. 5, the rear surface of the single-crystal Si substrate 1 is bonded to a tool 10 by an adhesive 9, and another tool 12 is bonded to the front surface of the protective film 6 by an adhesive 11. These tools 10 and 12 are strong enough to resist the pulling force applied in a subsequent step. For example, they may be made of a metal or quartz, for example. Also the adhesives 9 and 11 are strong enough to resist the pulling force applied in a subsequent step, and they may be a quick-setting bond, for example. In addition, a cutout 13 is made into an edge portion of the porous Si layer 2 to facilitate rupture of the porous Si layer 2 when pulled in a subsequent step. The cutout 13 may be made by an appropriate mechanical method or by irradiation of a laser beam.

Figure 6:
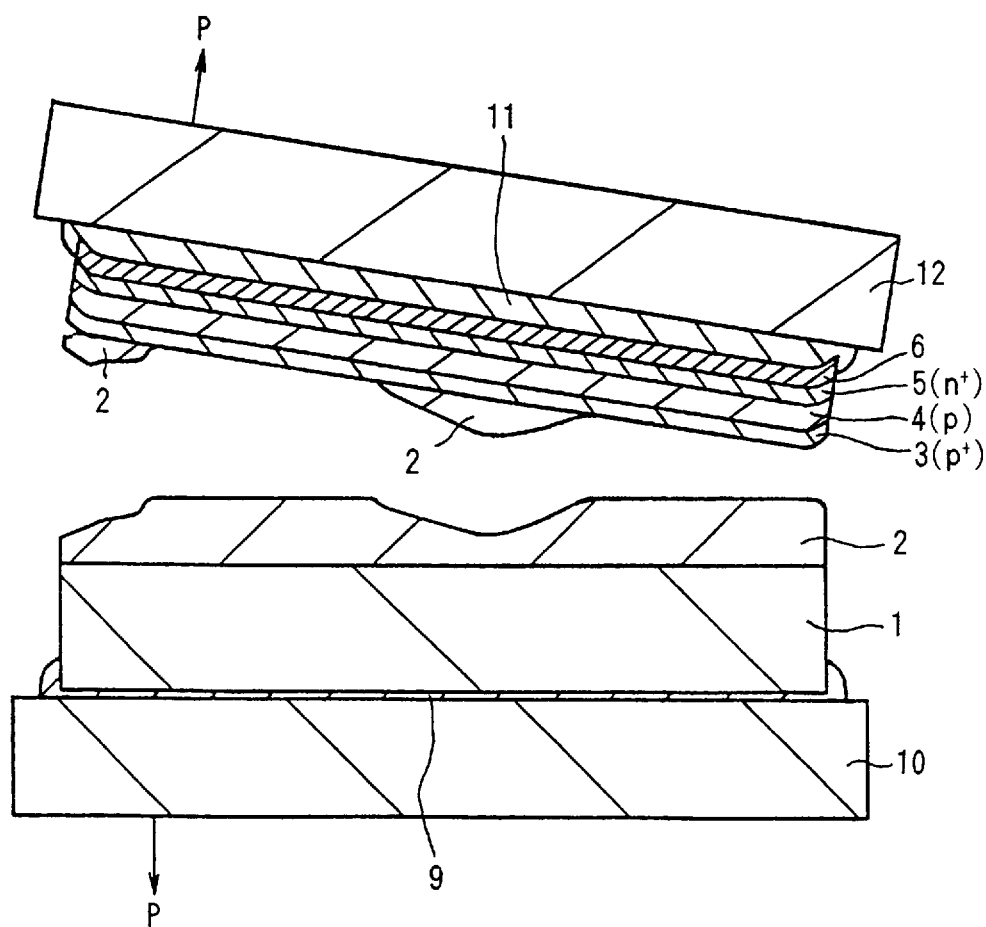
FIG. 6 is a cross-sectional view for explaining the method for fabricating a thin-film solar cell according to the first embodiment of the invention.

Next, as shown in FIG. 5, the tools 10 and 12 are pulled with a sufficiently large external force P. The external force P is applied to a site offset from the center of the single-crystal Si substrate 1 toward the edge with the cutout 13 of the porous Si layer 2 to invite stress concentration at the edge of the porous Si layer 2. As a result, since the porous Si layer 2 is inherently weak in mechanical strength and because of the existence of the cutout 13 in the edge wall of the porous Si layer 2 and the wedge-shaped gap 8 at the edge of the interface between the porous Si layer 2 and the p$^+$-type Si layer 3, stress concentration occurs prominently in these portions, and, as shown in FIG. 6, rupture occurs in the porous Si layer 2 and/or along the interface between the porous Si layer 2 and the p$^+$-type Si layer 3. In this manner, the single-crystal Si substrate 1 and the block of the p$^+$-type Si layer 3, p-type Si layer 4, n$^+$-type Si layer 5 and protective film 6 are separated from each other.

Figure 7:
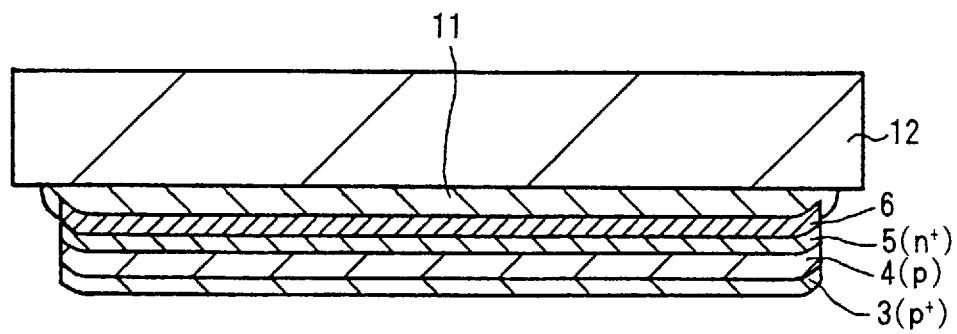
FIG. 7 is a cross-sectional view for explaining the method for fabricating a thin-film solar cell according to the first embodiment of the invention.
Figure 7:
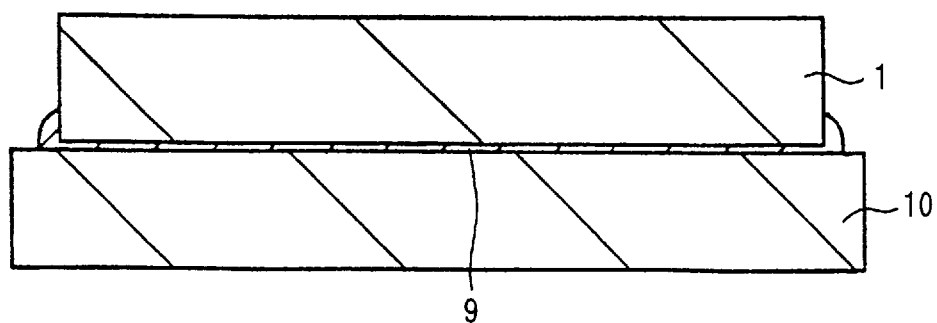

Next, as shown in FIG. 7, part of the porous Si layer 2 still remaining on the surface of the single-crystal Si substrate 1 and on the surface of the p$^+$-type Si layer 3, respectively, even after the rupture is removed by etching using an etchant such as HF/H$_2$O$_2$, for example. The single-crystal Si substrate 1 is used again as the substrate for fabricating another thin-film solar cell after removing the adhesive 9, detaching the tool 10, and polishing the surface. If the thickness of the porous Si layer 2 is 10 μm, the thickness of the single-crystal Si substrate 1 lost by the polishing for the next use is 3 μm or so, then the thickness of the single-crystal Si substrate 1 reduced in one cycle of fabrication of a thin-film solar cell is 13 μm. Therefore, the single-crystal Si substrate 1 loses a small amount of its thickness only by 130 μm even after used ten times, which means that each single-crystal Si substrate 1 can be used at least ten times.

Figure 8:
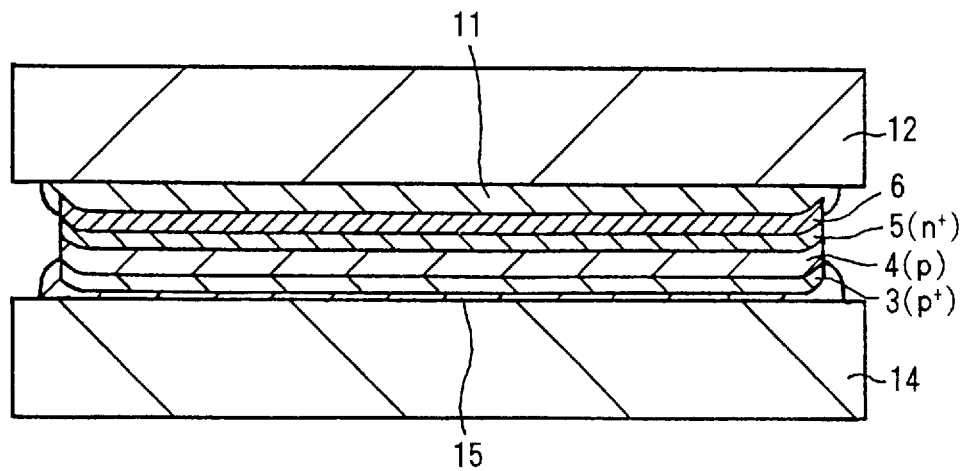
FIG. 8 is a cross-sectional view for explaining the method for fabricating a thin-film solar cell according to the first embodiment of the invention.

Next, as shown in FIG. 8, the exposed surface of the p$^+$-type Si layer 3 is bonded to a surface of a glass substrate 14, for example, by an adhesive 15. The adhesive 15 may be an epoxy resin, for example.

Figure 9:
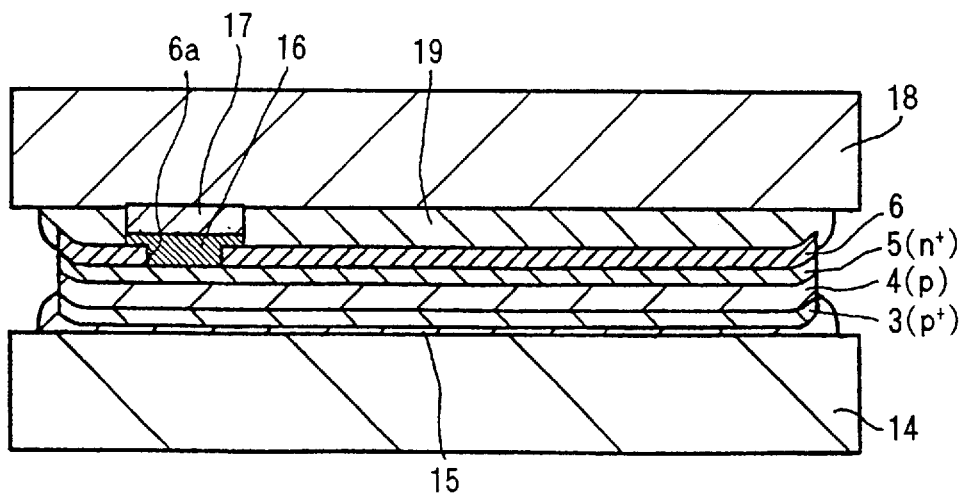
FIG. 9 is a cross-sectional view for explaining the method for fabricating a thin-film solar cell according to the first embodiment of the invention.

After removing the adhesive 11 and detaching the tool 12 from the protective film 6, the protective film 6 is selective etched off to make an opening 6a as shown in FIG. 9. Made through the opening 6a is an electrode 16 on incident surface (also called a front electrode) on the n$^+$-type Si layer 5. The front electrode 16 may be made by printing, for example. Apart from it, a plastic substrate 18 is prepared, having on it a metal layer 17 positionally corresponding to and geometrically identical to the front electrode 16, the front electrode 16 and the metal layer 17 are connected together. A gap made upon the connection between the protective film 6 and the plastic substrate 18 is filled with a transparent adhesive 19 of an epoxy resin, for example, to bond the protective film 6 and the plastic substrate 18 entirely.

Figure 10:
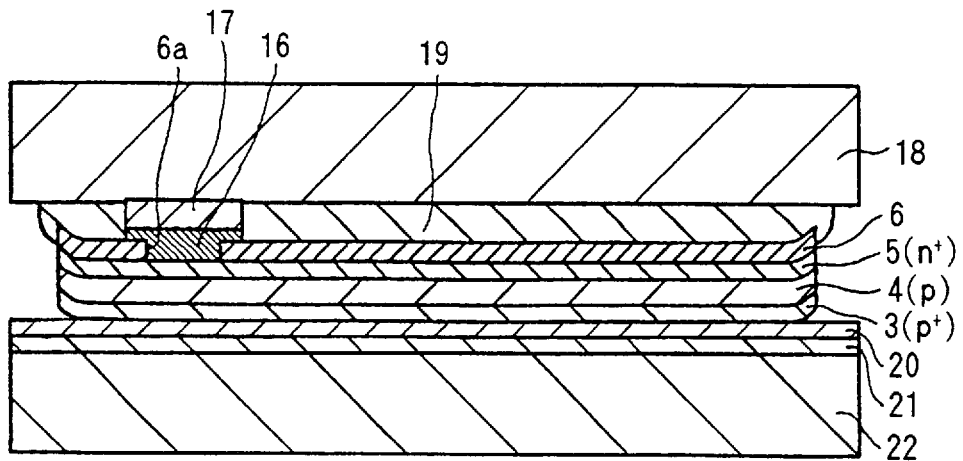
FIG. 10 is a cross-sectional view for explaining the method for fabricating a thin-film solar cell according to the first embodiment of the invention.

After that, the glass substrate 14 is detached from the p$^+$-type Si substrate 3 by removing the adhesive 15. Then, as shown in FIG. 10, a rear electrode 20 is formed on the p$^+$-type Si layer 3 by printing, for example, and a plastic substrate 22 is bonded to the rear electrode 20 with an adhesive 21. The rear electrode 20 serves also as a reflective plate for reflecting incident light in the thin-film solar cell, and contributes to an increase in efficiency.

In the process shown above, the intended thin-film solar cell is completed, in which the p$^+$-type Si layer 3, p-type Si layer 4, n$^+$-type Si layer 5 and protective film 6, which make up a solar cell, are sandwiched between two plastic substrates 18 and 22.

As explained above, according to the first embodiment of the invention, a thin-film solar cell is made by epitaxially growing the single-crystal p$^+$-type Si layer 3, p-type Si layer 4 and n$^+$-type Si layer 5 forming the solar cell layer in this order on the single-crystal Si substrate 1 via the porous Si layer 2, then separating the solar cell layer from the single-crystal Si substrate 1 by mechanically rupturing the porous Si layer 2 with a pulling force, and then sandwiching the solar cell layer between two plastic substrates 18 and 22. In this case, because of the solar cell layer being single-crystal, the thin-film solar cell exhibits a high efficiency and a satisfactory reliability. In addition, because of the single-crystal Si substrate 1 being usable repeatedly, the use of a mechanical method for separating the solar cell layer from the single-crystal Si substrate 1, the use of inexpensive plastic substrates 18 and 22, and other reasons, the thin-film solar cell can be fabricated at a low cost. Further, because the solar cell layer is thin and can be bent to an extent and because the plastic substrates 18 and 22 are flexible, the entirety of the thin-film solar cell can be bent to a certain extent and can be widely used such as being mounted along a curved portion of a car body or an outer curved portion of a portable electric appliance, for example.

That is, according to the first embodiment, thin-film solar cells having a high efficiency, high reliability and flexibility can be fabricated economically.

Next explained is a second embodiment of the invention.

Figure 11:
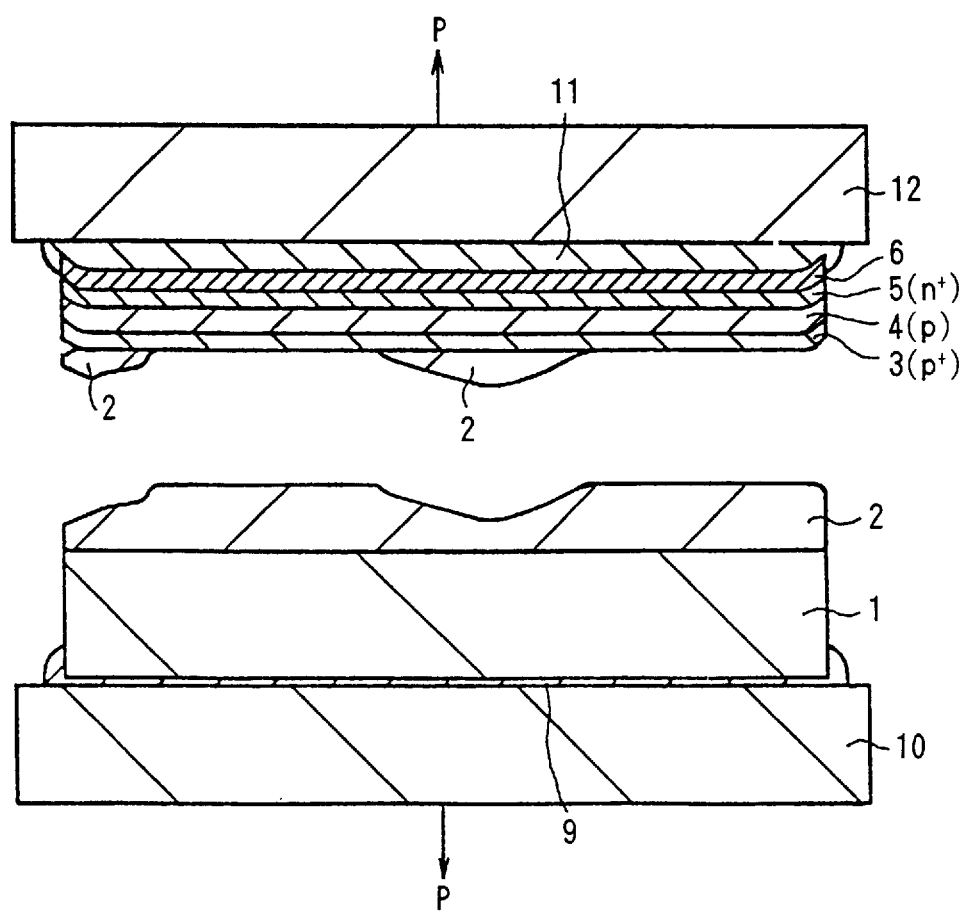
FIG. 11 is a cross-sectional view for explaining a method for fabricating a thin-film solar cell according to a second embodiment of the invention.

The method for fabricating a thin-film solar cell according to the first embodiment applies the external force P to the tools 10 and 12 in the manner shown in FIG. 5 upon separating the p$^+$-type Si layer 3, p-type Si layer 4, n$^+$-type Si layer 5 and protective film 6 from the single-crystal Si substrate 1 by rupturing the porous Si layer 2. In contrast, the method for fabricating a thin-film solar cell according to the second embodiment ruptures the porous Si layer 2 by applying the external force P to the tools 10 and 12 in a different manner as shown in FIG. 11 to separate the p$^+$-type Si layer 3, p-type Si layer 4, n$^+$-type Si layer 5 and protective film 6 from the single-crystal Si substrate 1. The other features of the method according to the second embodiment are identical to the method according to the first embodiment, and their explanation is not repeated here.

Also the second embodiment, like the first embodiment, can fabricate inexpensive thin-film solar cells having a high efficiency, high reliability and flexibility.

Next explained is a third embodiment of the invention.

Figure 12:
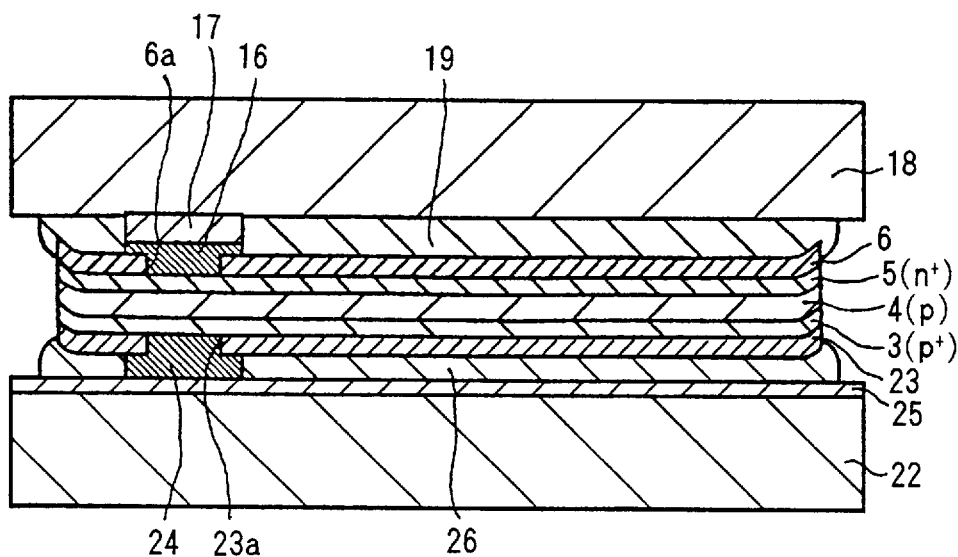
FIG. 12 is a cross-sectional view for explaining a method for fabricating a thin-film solar cell according to a third embodiment of the invention.

As shown in FIG. 10, in the method for fabricating a thin-film solar cell according to the first embodiment where the entire surface of the p$^+$-type Si film 3 is in contact with the rear electrode 20, recombination of electron-hole pairs generated by incident light is liable to occur along the interface between the p$^+$-type Si layer 3 and the rear electrode 20 and is likely to decrease the efficiency. Taking it into consideration, the method according to the third embodiment makes a protective film 23 in the form of a single-layered SiO$_2$ film, SiN film or a multi-layered film comprising these single-layered films on the p$^+$-type Si layer 3 as shown in FIG. 12, then makes an opening 23a in the protective film 23, makes a rear electrode 24 through the opening 23a by printing, and connects the rear electrode 24 to a metal layer 25 preliminarily formed on the plastic substrate 22. A gap made upon the connection between the protective film 23 and the metal layer 25 is filled with a transparent adhesive 26 of an epoxy resin, for example, to bond the protective film 23 and the metal layer 25 entirely. The other features of the method according to the third embodiment are identical to the method according to the first embodiment, and their explanation is not repeated here.

Since the third embodiment significantly decreases recombination of electron-hole pairs along the interface between the p$^+$-type Si layer 3 and the rear electrode 24, it can provide a thin-film solar cell with a higher efficiency than that made by the first embodiment while having the same advantages as those of the first embodiment.

Next explained is a fourth embodiment of the invention.

The method for fabricating a thin-film solar cell according to the first embodiment once bonds the rear surface of the solar cell layer to the glass substrate 14 in the step shown in FIG. 8 and, after detaching the glass substrate 14, bonds the solar cell layer to the plastic substrate 22 in the step shown in FIG. 10. The method according to the fourth embodiment, however, straightforwardly makes the rear electrode 20 by printing on the p$^+$type Si layer 3 without bonding the solar cell layer to the glass substrate 14, and then bonds the rear electrode 20 to the plastic substrate 22 with the adhesive 21. After that, the method detaches the tool 12 by removal of the adhesive 11, then makes the opening 6a in the protective film 6 and the front electrode 16 in the opening 6a, connects the front electrode 16 with the metal layer 17 on the plastic substrate 18, and bonds the protective film 6 to the plastic substrate 18 by filling the gap between them with the adhesive 19. The other features of the method according to the fourth embodiment are identical to the method according to the first embodiment, and their explanation is not repeated here.

According to the fourth embodiment, the manufacturing process can be simplified as compared with the first embodiment, and more economical thin-film solar cells can be fabricated.

Next explained is a fifth embodiment of the invention.

Although the method for fabricating a thin-film solar cell according to the first embodiment makes the front electrode 16 in the step shown in FIG. 9, the method according to the fifth embodiment makes the front electrode 16 together with the opening 6a in the protective film 6 in the step shown in FIG. 3. The other features of the method according to the fifth embodiment are identical to the method according to the first embodiment, and their explanation is not repeated here.

Also the fifth embodiment gives the same advantages as those of the first embodiment.

Next explained is a sixth embodiment of the invention.

Figure 13:
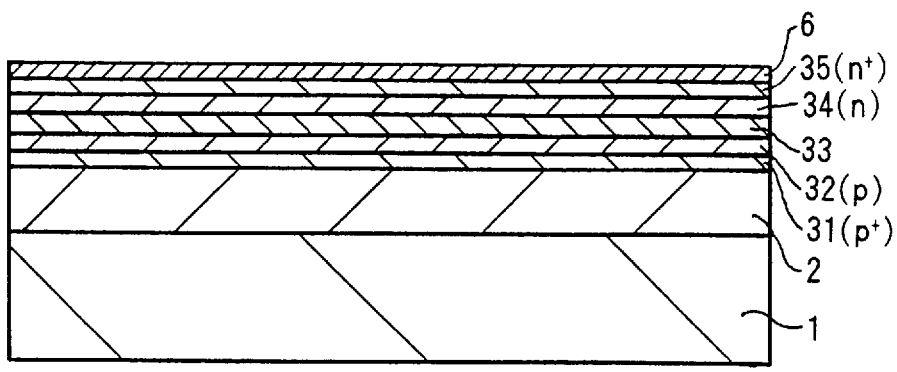
FIG. 13 is a cross-sectional view for explaining a method for fabricating a thin-film solar cell according to a sixth embodiment of the invention.

In the method for fabricating a thin-film solar cell according to the sixth embodiment, the solar cell layer has a double-hetero structure. That is, as shown in FIG. 13, the sixth embodiment epitaxially grows a p$^+$-type Si layer 31, p-type Si$_{1-x}$Ge$_x$ graded layer 32, undoped Si$_{1-y}$Ge$_y$ layer 33, for example, n-type Si$_{1-x}$Ge$_x$ graded layer 34 and n$^+$-type Si layer 35 on the porous Si layer 2 in this order to make a solar cell layer of a double-hetero structure. In this case, the composition ratio x of Ge in the p-type Si$_{1-x}$Ge$_x$ graded layer 32 monotonously increases in the thickness direction of the p-type Si$_{1-x}$Ge$_x$ graded layer 32 from the value of 0 at the interface between the p$^+$-type Si layer 31 and the p-type Si$_{1-x}$Ge$_x$ graded layer 32 to the value of y at the interface between the Si$_{1-y}$Ge$_y$ layer 33 and the p-type Si$_{1-x}$Ge$_x$ graded layer 32. The composition ratio x of Ge in the n-type Si$_{1-x}$Ge$_x$ graded layer 34 monotonously increases in the thickness direction of the n-type Si$_{1-x}$Ge$_x$ graded layer 34 from the value of 0 at the interface between the n$^+$-type Si layer 35 and the n-type Si$_{1-x}$Ge$_x$ graded layer 34 to the value of y at the interface between the Si$_{1-y}$Ge$_y$ graded layer 33 and the n-type Si$_{1-x}$Ge$_x$ graded layer 34. In this manner, lattices match at respective interfaces of p$^+$-type Si layer 31, p-type Si$_{1-x}$Ge$_x$ graded layer 32, Si$_{1-y}$Ge$_y$ layer 33, n-type Si$_{1-x}$Ge$_x$ graded layer 34 and n$^+$-type Si layer 35, and an excellent crystallinity can be obtained. The other features of the method according to the sixth embodiment are identical to the method according to the first embodiment, and their explanation is not repeated here.

According to the sixth embodiment, because of the solar cell layer having a double-hetero structure and capable of effectively confining carriers and light in its central Si$_{1-y}$Ge$_y$ layer 33, a high efficiency can be obtained, and the same various advantages as those of the first embodiment can be obtained.

Next explained is a seventh embodiment of the invention, which is an application of the invention to a method for fabricating a CMOS semiconductor device.

Figure 14:
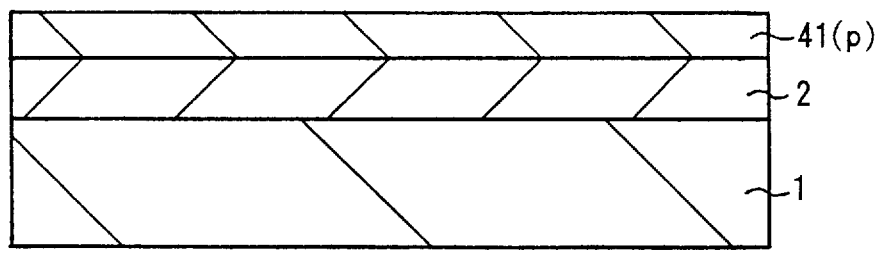
FIG. 14 is a cross-sectional view for explaining a method for fabricating a CMOS semiconductor device according to a seventh embodiment of the invention.

The method for fabricating a CMOS semiconductor device according to the seventh embodiment first makes the porous Si layer 2 on the single-crystal Si substrate 1 as shown in FIG. 14, and then epitaxially grows a single-crystal p-type Si layer 41 on the porous Si layer 2 by CVD, for example. The thickness of the p-type Si layer 41 is chosen appropriately, for example, to 5 μm. The impurity concentration of the p-type Si layer 41 may be, for example, about $10^{15}$cm$^{-3}$.

Figure 15:
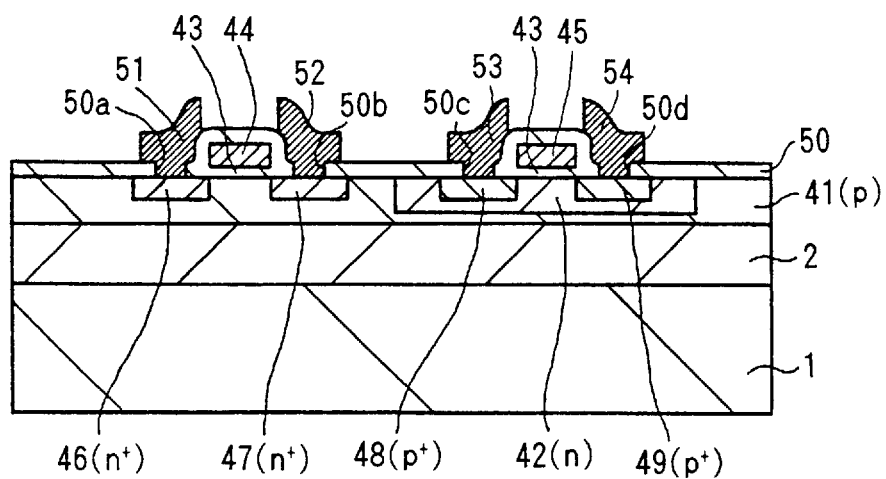
FIG. 15 is a cross-sectional view for explaining the method for fabricating a CMOS semiconductor device according to the seventh embodiment of the invention.

Next, as shown in FIG. 15, an n-well 42 is formed by selectively doping an n-type impurity in the p-type Si layer 41 by ion implantation or thermal diffusion. After that, a gate insulating film 43, such as SiO$_2$ film, is made on the p-type Si layer 41 by thermal oxidization, for example, on which gate electrodes 44, 45 are next made on the gate insulating layer 43. These gate electrodes 44, 45 may be made, for example, by forming a polycrystalline Si film on the gate insulating film 43 by CVD or other appropriate method, then lowering the resistance by doping an impurity in the polycrystalline Si film, and patterning the impurity-doped polycrystalline Si film by etching.

After that, by ion-implanting an n-type impurity in the p-type Si film 41, using the gate electrode 44 as a mask, while covering the surface of the portion of the n-well 42 with a mask, n$^+$-type regions 46, 47 used as source and drain regions are made in self-alignment with the gate electrode 44. After removing the mask used for ion implantation of the n-type impurity and in the presence of another mask covering the surface of the remainder portion other than the portion of the n-well 42, a p-type impurity is ion-implanted in the n-well 42, using the gate electrode 45 as a mask, to form p$^+$-type regions 48, 49 used as source and drain regions in self-alignment with the gate electrode 45.

After that, an inter-layer insulating film 50 such as SiO$_2$ film is formed on the entire surface by CVD, for example, and the inter-layer insulating film 50 is selectively etched off to make contact holes 50a, 50b, 50c and 50d. After an Al film, for example, is next made on the entire surface by sputtering or vacuum evaporation, for example, the Al film is patterned by etching to form electrodes 51, 52, 53 and 54. In this case, the gate electrode 44 and n$^+$-type regions 46, 47 make up an n-channel MOS transistor, and the gate electrode 45 and p$^+$-type regions 48, 49 make up a p-channel MOS transistor. These n-channel MOS transistor and p-channel MOS transistor make up a CMOS.

After that, in the same manner as shown in FIG. 5 of the first embodiment, the rear surface of the single-crystal Si substrate 1 is bonded to the tool 10 by the adhesive 9, and the tool 12 is bonded to the surface of the CMOS semiconductor device by the adhesive 11. Next, these tools 10 and 12 are pulled in opposite directions by external forces P to rupture the porous Si layer 2 and to separate the CMOS semiconductor device from the single-crystal Si substrate 1.

Figure 16:
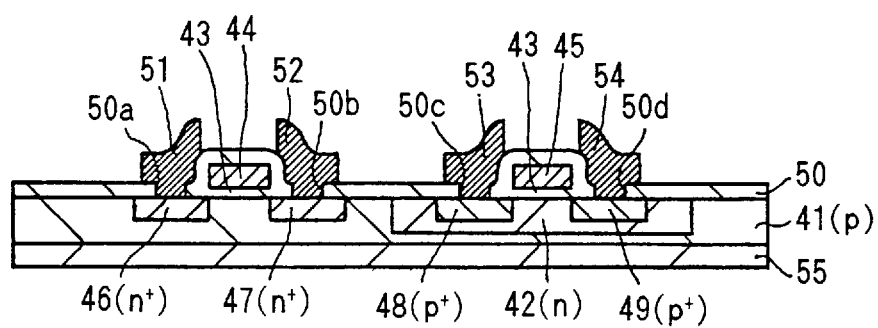
FIG. 16 is a cross-sectional view for explaining the method for fabricating a CMOS semiconductor device according to the seventh embodiment of the invention.

After that, the porous Si layer 2, if any, is removed from the rear surface of the p-type Si layer 41, and the tools 10 and 12 are detached. Then, as shown in FIG. 16, the rear surface of the p-type Si layer 41 is bonded to a heat sink 55 of a metal or other material with silver paste, for example. After that, the structure is pelletized, if desired.

In this manner, the CMOS semiconductor device having the heat sink 55 on the rear surface of the p-type Si layer 41 is completed.

According to the seventh embodiment, since the p-type Si layer 41 forming an active layer is single-crystal, inexpensive CMOS semiconductor devices having a high performance equivalent to that of CMOS using bulk Si can be produced. Additionally, since the CMOS semiconductor device has the heat sink 55 on the rear surface of the p-type Si layer 41, the temperature does not increase so much during operation, and deterioration or malfunction caused by an increase in temperature can be prevented.

Next explained is an eighth embodiment of the invention, which is an application of the invention to a method for fabricating a semiconductor laser of a double-hetero structure.

Figure 17:
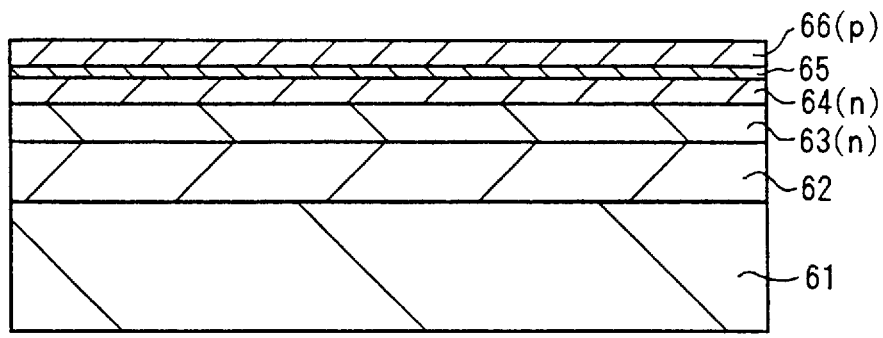
FIG. 17 is a cross-sectional view for explaining a method for fabricating a semiconductor laser according to an eighth embodiment of the invention.

The method for fabricating a semiconductor laser according to the eighth embodiment first makes a porous GaAs layer 62 on a single-crystal GaAs substrate 61 as shown in FIG. 17. Next epitaxially grown on the porous GaAs layer 62 is an n-type GaAs layer 63 on which epitaxially grown are an n-type AlGaAs layer 64 as an n-type cladding layer, active layer 65 of GaAs and p-type AlGaAs layer 66 as a p-type cladding layer in sequence to form a laser structure. The thickness of the n-type GaAs layer 63 is chosen appropriately, for example, to 5 $\mu$m.

In the same manner as shown in FIG. 5 of the first embodiment, the rear surface of the single-crystal GaAs substrate 61 is bonded to the tool 10 by the adhesive 9, and the tool 12 is bonded to the front surface of the p-type AlGaAs layer 66 by the adhesive 11. After that, these tools 10 and 12 are pulled in opposite direction by external forces P to rupture the porous GaAs layer 62 and to separate the block of the n-type GaAs layer 63, n-type AlGaAs layer 64, active layer 65 and p-type AlGaAs layer 66 from the single-crystal GaAs substrate 61.

After removing the porous GaAs layer 62 remaining on the n-type GaAs layer 63 and detaching the tools 10 and 12, an n-side electrode (not shown) is formed on the rear surface of the n-type GaAs layer 63, and a p-side electrode (not shown) is formed on the p-type AlGaAs layer 66. Thus, an intended semiconductor laser having a double-hetero structure is obtained.

According to the eighth embodiment, inexpensive semiconductor lasers having a double-hetero structure can be fabricated. Additionally, since the n-type GaAs layer 63 serving as a substrate of the semiconductor laser is very thin as compared with an n-type GaAs substrate typically used in conventional semiconductor lasers, the series resistance of the substrate can be reduced remarkably, and the voltage for operating the semiconductor laser can be reduced so much.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, although the first embodiment epitaxially grows the $p^+$-type Si layer 3, p-type Si layer 4 and $n^+$-type Si layer 5 on the porous Si layer 2 by CVD, it can be modified such that an amorphous Si layer is formed on the porous Si layer 2 by plasma CVD or other appropriate process and then annealed at a temperature of 600° C. to 800° C. to crystallize the amorphous Si layer by solid phase growth. In this case, since the porous Si layer 2 behaves as a seed crystal, a high-quality solid epitaxial layer can be obtained.

The $Si_{1-y}Ge_y$ 33 used in the sixth embodiment may be replaced by a Ge layer.

The invention is also applicable to fabrication of SOI (silicon on insulator) substrates, for example.

As described above, since the invention separates a device-forming layer from a base body by causing mechanical rupture at least at one of inner portions of a separation layer and interfaces of the separation layer with the base body and the device-forming layer, high-performance thin-film devices, such as thin-film solar cells having a high efficiency, can be made economically.

What is claimed is:

1. A method for separating a semiconductor layer from a substrate, comprising:

forming a porous layer on a surface of a substrate by an anodic oxidization;

forming at least one semiconductor layer on said porous layer; and separating said semiconductor layer from said substrate by forming a mechanical rupture in said porous layer or along an interface formed between the porous layer and the substrate or between the porous layer and the semiconductor layer.

2. A method for separating a semiconductor layer from a substrate according to claim 1, wherein said substrate is a Si substrate.

3. A method for separating a semiconductor layer from a substrate according to claim 1, wherein said porous layer is a Si porous layer.

4. A method for separating a semiconductor layer from a substrate according to claim 1, wherein the method further comprises a step of oxidizing said porous layer after forming said porous layer.

5. A method for separating a semiconductor layer from a substrate according to claim 4, wherein said porous layer is oxidized at a temperature of 400° C. to 600° C.

6. A method for separating a semiconductor layer from a substrate according to claim 1, wherein the method further comprises a step of $H_2$-annealing said porous layer after forming said porous layer.

7. A method for separating a semiconductor layer from a substrate according to claim 6, wherein said porous layer is $H_2$-annealed at a temperature of 950° C. to 1000° C.

8. A method for separating a semiconductor layer from a substrate according to claim 1, wherein the method further comprises the steps of: forming a oxide film on a entire surface of said semiconductor layer, said porous layer and said substrate; and removing said oxide film to form a wedge-shaped gap in an interface between said porous layer and said semiconductor layer.

9. A method for separating a semiconductor layer from a substrate, comprising:

forming a porous layer on a surface of a substrate;

$H_2$-annealing said porous layer;

forming at least one semiconductor layer on said porous layer;

separating said semiconductor layer from said substrate by forming a mechanical rupture within said porous layer or along an interface formed between the substrate and the porous layer or between the porous layer and said semiconductor layer.

10. A method for separating a semiconductor layer from a substrate, comprising:

forming a porous layer on a surface of a substrate;

oxidizing said porous layer;

forming at least one semiconductor layer on said porous layer;

separating said semiconductor layer from said substrate by forming a mechanical rupture within said porous layer or along an interface formed between the substrate and the porous layer or between the porous layer and said semiconductor layer.

11. A method for manufacturing a solar cell, comprising;

forming a porous layer on a surface of a substrate by anodic oxidization;

forming a plurality of semiconductor layers on said porous layer to form the solar cell;

separating said plurality of semiconductor layers from said substrate by forming a mechanical rupture within said porous layer or along an interface formed between the substrate and the porous layer or between the porous layer and said semiconductor layer.

* * * * *

Adverse Decision in Interference

Patent No. 5,811,348, Takeshi Matsushita, Hiroshi Tayanaka, METHOD FOR SEPARATING A DEVICE-FORMING LAYER FROM A BASE BODY, Interference No. 105,263, final judgment adverse to the patentees rendered, October 27, 2005, as to claims 1-7, 9-11.

*(Official Gazette April 25, 2006)*